(12) United States Patent
Strauch et al.

(10) Patent No.: US 7,294,207 B2
(45) Date of Patent: *Nov. 13, 2007

(54) GAS-ADMISSION ELEMENT FOR CVD PROCESSES, AND DEVICE

(75) Inventors: Gerd Strauch, Aachen (DE); Johannes Kaeppeler, Würselen (DE); Martin Dauelsberg, Aachen (DE)

(73) Assignee: Aixtron AG (DE)

( * ) Notice: Subject to any disclaimer, the term of this patent is extended or adjusted under 35 U.S.C. 154(b) by 562 days.

This patent is subject to a terminal disclaimer.

(21) Appl. No.: 10/395,948

(22) Filed: Mar. 24, 2003

(65) Prior Publication Data

US 2003/0177977 A1 Sep. 25, 2003

Related U.S. Application Data

(63) Continuation of application No. PCT/EP01/08139, filed on Jul. 14, 2001.

(30) Foreign Application Priority Data

| Sep. 22, 2000 | (DE) | ................. 100 61 671 |
| Dec. 23, 2000 | (DE) | ................. 100 64 941 |

(51) Int. Cl.
| C23C 16/455 | (2006.01) |
| H01L 21/306 | (2006.01) |
| C23F 1/00 | (2006.01) |
| C23C 16/06 | (2006.01) |
| C23C 16/18 | (2006.01) |

(52) U.S. Cl. .................. 118/715; 118/719; 156/345.29; 156/345.33

(58) Field of Classification Search ................. 118/715, 118/723 E; 156/345.33–35
See application file for complete search history.

(56) References Cited

U.S. PATENT DOCUMENTS

| 3,674,453 A * | 7/1972 | Loukes et al. ............. 65/30.13 |
| 3,757,733 A * | 9/1973 | Reinberg ..................... 118/725 |
| 4,033,287 A * | 7/1977 | Alexander et al. ....... 118/723 E |

(Continued)

FOREIGN PATENT DOCUMENTS

DE 10133914 A1 * 1/2003

(Continued)

*Primary Examiner*—Rudy Zervigon
(74) *Attorney, Agent, or Firm*—St. Onge Steward Johnston & Reens LLC (57) ABSTRACT

The invention relates to a method for depositing especially, crystalline layers onto especially, crystalline substrates. At least two process gases are led into a process chamber of a reactor separately from each other, through a gas inlet mechanism above a heated susceptor. The first process gas flows through a central line with a central outlet opening and the second process gas flows through a line which is peripheral thereto and which has a peripheral outlet opening that is formed by a gas-permeable gas outlet ring. Said gas outlet ring surrounds a ring-shaped pre-chamber. The invention provides that in order to avoid a parasitic deposition in the area of the peripheral outlet opening, the end section of the gas outlet ring that faces towards the susceptor or the radially outer section of the surface of the gas outlet mechanism surrounding the central outlet opening is cooled by the second process gas according to a truncated cone or revolution hyperboloid shape of a gas guiding surface formed by the pre-chamber back wall.

9 Claims, 7 Drawing Sheets

U.S. PATENT DOCUMENTS

| | | | |
|---|---|---|---|
| RE30,244 E * | 4/1980 | Alexander et al. | 118/723 E |
| 4,207,137 A * | 6/1980 | Tretola | 438/10 |
| 4,533,410 A * | 8/1985 | Ogura et al. | 117/99 |
| 4,590,042 A * | 5/1986 | Drage | 422/186.06 |
| 4,612,077 A * | 9/1986 | Tracy et al. | 156/345.34 |
| 4,778,559 A * | 10/1988 | McNeilly | 118/728 |
| 4,793,975 A * | 12/1988 | Drage | 422/186.05 |
| 4,993,358 A * | 2/1991 | Mahawili | 118/715 |
| 5,027,746 A * | 7/1991 | Frijlink | 118/724 |
| 5,275,976 A * | 1/1994 | Moslehi | 438/800 |
| 5,366,557 A * | 11/1994 | Yu | 118/725 |
| 5,422,139 A * | 6/1995 | Fischer | 427/248.1 |
| 5,849,088 A * | 12/1998 | DeDontney et al. | 118/719 |
| 5,954,881 A | 9/1999 | Burk, Jr. et al. | 118/715 |
| 6,007,633 A * | 12/1999 | Kitamura et al. | 118/724 |
| 6,039,812 A * | 3/2000 | Ellison et al. | 118/725 |
| 6,056,824 A * | 5/2000 | Bartholomew et al. | 118/719 |
| 6,246,030 B1 * | 6/2001 | Matsuyama | 219/390 |
| 6,352,592 B1 * | 3/2002 | Bartholomew et al. | 118/719 |
| 6,444,042 B1 * | 9/2002 | Yang et al. | 118/724 |
| 6,487,986 B1 * | 12/2002 | Liehr et al. | 118/723 MW |
| 6,537,418 B1 * | 3/2003 | Muller et al. | 156/345.34 |
| 6,539,890 B1 * | 4/2003 | Felts | 118/723 R |
| 6,576,060 B1 * | 6/2003 | Stoddard et al. | 118/715 |
| 6,592,771 B1 * | 7/2003 | Yamanaka et al. | 216/63 |
| 6,676,758 B2 * | 1/2004 | Sillmon et al. | 118/715 |
| 6,737,812 B2 * | 5/2004 | Yuasa et al. | 315/111.71 |
| 6,770,137 B2 * | 8/2004 | Hara et al. | 117/201 |
| 6,786,973 B2 * | 9/2004 | Strauch et al. | 118/715 |
| 6,830,618 B2 * | 12/2004 | Hara et al. | 117/200 |
| 6,849,241 B2 * | 2/2005 | Dauelsberg et al. | 423/328.2 |
| 6,890,386 B2 * | 5/2005 | DeDontney et al. | 118/715 |
| 2003/0177977 A1 * | 9/2003 | Strauch et al. | 117/84 |
| 2004/0134429 A1 * | 7/2004 | Yamanaka et al. | 118/723 E |
| 2004/0182316 A1 * | 9/2004 | Watanabe | 118/715 |
| 2005/0000441 A1 * | 1/2005 | Kaeppeler et al. | 118/723 E |

FOREIGN PATENT DOCUMENTS

| | | |
|---|---|---|
| DE | 10247921 A1 * | 4/2004 |
| EP | 0 334 432 | 9/1989 |
| EP | 0 334 433 | 9/1989 |
| GB | 1056430 | 1/1967 |
| WO | WO 98/45501 | 10/1998 |
| WO | WO 218680 A1 * | 3/2002 |
| WO | WO 227078 A1 * | 4/2002 |
| WO | WO 3038144 A1 * | 5/2003 |

* cited by examiner

GAS-ADMISSION ELEMENT FOR CVD PROCESSES, AND DEVICE

This application is a continuation of pending International Patent Application No. PCT/EP01/08139 filed Jul. 14, 2001, which designates the United States and claims priority of pending German Application Nos. 10061671, filed Sep. 22, 2000 and 10064941, filed Dec. 23, 2000.

FIELD OF THE INVENTION

The invention relates firstly to a method for depositing in particular crystalline layers on in particular crystalline substrates, in which at least two process gases are introduced into a process chamber of a reactor separately from one another through a gas-admission element above a heated susceptor, the first process gas flowing through a central line having a central outlet opening, and the second process gas flowing through a line which is peripheral with respect to the central line and has a peripheral outlet opening formed by a gas-permeable gas-discharge ring, which gas-discharge ring surrounds an annular antechamber. The invention also relates to a gas-admission element for a device for depositing in particular crystalline layers on in particular crystalline substrates, by means of which two process gases can be introduced into a process chamber of a reactor separately from one another above a heated susceptor, having a central line with a central end-side outlet opening for the first process gas, and having a line which is peripheral with respect to the central line and has a peripheral outlet opening for the second process gas, which is formed by a gas-permeable gas-discharge ring which surrounds an annular antechamber, the radial width of which decreases toward the free end of the rotationally symmetrical gas-discharge element, on account of a back wall which does not run parallel to the central axis in longitudinal section.

A gas-discharge element of this type is known and is used to introduce the reaction gases, in particular for an MOCVD process, into a cylindrically symmetrical process chamber, through which the process gases flow in the radial direction, in order to emerge again through a ring which surrounds the process chamber. Substrates, which are coated with the decomposition products of the reaction gases introduced through the gas-admission element, are disposed in planetary fashion on the susceptor, which is heated from below in particular by means of high frequency. In the region of the gas-admission element or the region which immediately borders it in the radially outward direction, the process chamber has an admission zone in which the gaseous starting materials decompose. In the radially outward direction, this admission zone is adjoined by a deposition zone, within which the decomposition products diffuse toward the substrate, in order to condense there to form a single-crystalline layer.

In the known device, the second process gas passes axially into the center of the process chamber through the peripheral feed line. The second process gas used is, for example, TMG or TMI together with a carrier gas, for example hydrogen. The gas comes into contact with a rebounding wall which is formed by the back wall, which runs substantially in the shape of a bell, of the antechamber. The gas-discharge ring has comb-like slots, through which the gas can flow from the antechamber into the admission zone of the process chamber, where it undergoes preliminary decomposition. The metal hydrides, for example phosphine or arsine, enter the process chamber together with a carrier gas through the central feed line. The central opening is disposed close to the heated susceptor. This process gas emerging there flows through a gap between the surface of the heated susceptor and the end face of the free end of the gas-admission element. On account of the thermal radiation of the heated susceptor, the end face of the gas-admission element may heat up. As a corollary effect, the entire quartz body which forms that portion of the gas-admission element which projects into the process chamber is heated up. In particular that portion of the antechamber which is associated with the free end of the gas-admission element and/or the adjoining portion of the gas-discharge ring may in the process reach temperatures at which the metal-organic compounds of gallium or indium supplied through the peripheral line are decomposed, so that deposition of gallium arsenide or indium phosphide occurs in this region of the antechamber or at the gas-discharge ring. These parasitic depositions are disadvantageous.

While gallium arsenide and/or indium phosphide are deposited on hot surfaces, if the outer peripheral portion of the end face surrounding the central feed line is too cold, condensation of phosphorus or arsenic may occur there. This too constitutes a drawback.

The invention is based on the object of proposing measures, in order on the one hand to counteract parasitic deposition in the region of the peripheral outlet opening and on the other hand to counteract condensation of the V component emerging through the central outlet opening on the radially outer peripheral portion of the end face of the gas-discharge element.

The object is achieved by the invention described in the claims. Claim 1 proposes that on account of a frustoconical or rotationally hyperboloid shape of a gas-guiding surface formed by the antechamber rear wall, that end portion of the gas-discharge ring which faces the susceptor and/or the radially outer portion of that end side of the gas-discharge element which surrounds the central outlet opening is cooled by the second process gas. In this case, the gas stream which is to be fed to the process chamber from the second feed line is deflected by the gas-guiding surface, in such a manner that it is heated up at the rear wall, which is heated by the radiation of the susceptor, of that portion of the gas-admission element which projects into the process chamber. The heat which is dissipated in the process cools that portion of the antechamber or of the gas-discharge ring which is close to the susceptor. The shape of the gas-guiding surface can be selected in such a way that the cooling occurs only to an extent which is such that the temperature in the end portion of the gas-admission element is kept within a temperature window which is delimited at the bottom by the deposition temperature of the V component and at the top by the deposition temperature of the III-V compound. On account of a porous gas-discharge ring, the pressure in the antechamber is preferably held at a higher level than the process-chamber pressure. Moreover, the use of a porous gas-discharge ring has the advantage compared to the comb-like gas-discharge ring that no turbulence which promotes parasitic deposition develops behind the comb tines. If the gas-discharge element consists, for example, of a quartz frit, the process gas emerges from the gas-discharge ring in homogenized form, the maximum flow of the flow profile lying eccentrically, specifically offset toward the free end of the gas-admission element. The radius of curvature of the guiding surface, which is concave in longitudinal section, is matched to the flow parameters. For higher volumetric flows, the radius of curvature is selected to be greater than for lower volumetric flows. The longitudinal-section contour of the gas-guiding surface may then in particular be a straight line, so that overall the gas-guiding surface is frustoconical in shape. To enable the gas-guiding surface contour to be matched to the various process parameters, such as temperature and overall flow volume, it is provided, according to the invention, that the portion of the gas-admission element which projects into the process chamber is formed as an exchangeable part. This can be screwed to the feed line. It is preferably a quartz part which is also the carrier of the gas-discharge ring. The gas-discharge ring has a gas-guiding surface which is formed by the antechamber rear wall, is configured to be frustoconical or rotationally hyperboloid in shape and links up with the feed line without any step. The gas stream flowing in laminar fashion along the gas-guiding surface effects convective cooling. The increased outlet flow from the gas-discharge ring in the region close to the susceptor also results in a purging effect. In the case of a gallium arsenide deposition process, the temperature of that portion of the gas-admission element which is close to the susceptor is kept within a temperature window between approximately 200° C. and approximately 400° C.

BRIEF DESCRIPTION OF DRAWINGS

Exemplary embodiments of the inventions are explained below with reference to accompanying drawings, in which.

DETAILED DESCRIPTION OF DRAWINGS

The exemplary embodiment shown in FIGS. 1 to 5 presents an excerpt from an MOCVD reactor. The process chamber bears reference number 1. It has a base 1' and a ceiling 1". The base 1' is the surface of a susceptor 16 which is heated from below by means of high frequency and consists of graphite. The gas-admission element is located in the center of the cylindrically symmetrical process chamber 1. This gas-admission element has a central feed line 2, which opens out in a central outlet opening 3. This central outlet opening lies in an end-side chamber of the gas-admission element. The end side is associated with a quartz body 14. The latter has a frustoconical wall which forms a gas-guiding surface 15 for the gas flowing out of a peripheral feed line 4 in the axial direction. The gas which flows out of the peripheral feed line 4 flows into an annular antechamber 8 which is disposed between process-chamber ceiling 1" and process-chamber base 1' and the rear wall of which is formed by the gas-guiding surface 15.

Figure 1:
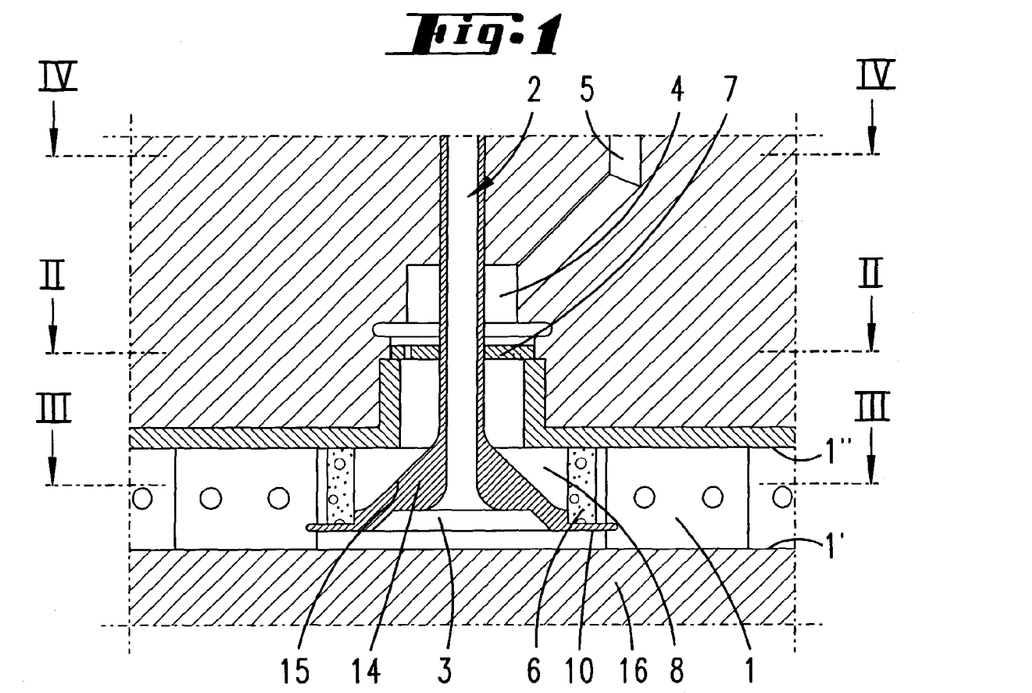
FIG. 1 shows a first exemplary embodiment of a gas-admission element.
Figure 2:
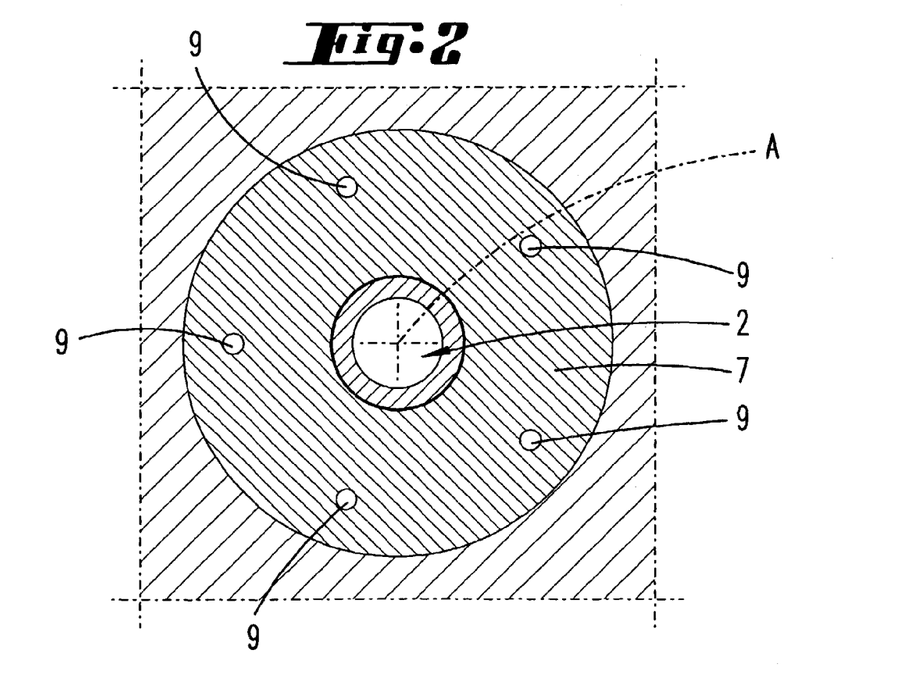
FIG. 2 shows a section on line II-II.
Figure 3:
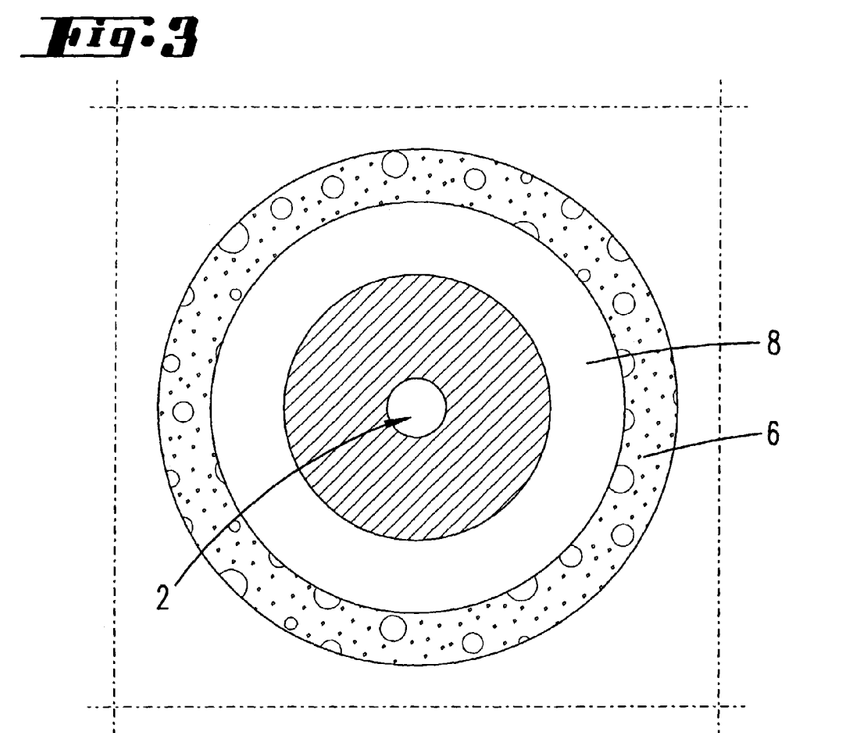
FIG. 3 shows a section on line III-III.
Figure 4:
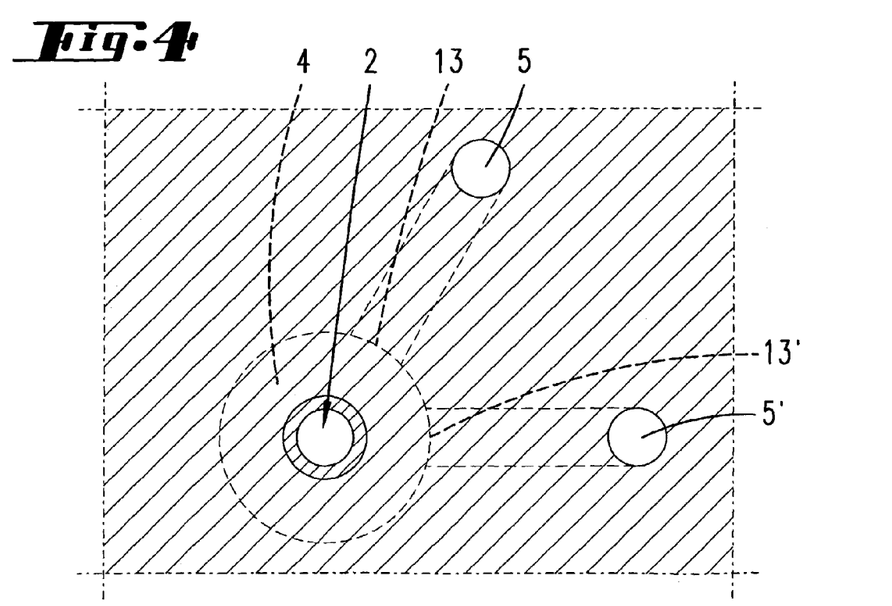
FIG. 4 shows a section on line IV-IV.

The annular antechamber 8 is surrounded by a porous gas-discharge ring 6, which is produced as quartz frit. The second process gas which flows in through the peripheral line 4 can emerge through this gas-discharge ring in a homogenized flow profile.

Upstream of the antechamber 8 there is an annular throttle 7 with a multiplicity of passage openings 9. Upstream of the annular throttle 7 there is in turn a mixing chamber, into which two gases feed lines 5, 5' open out at the locations denoted by reference numerals 13 and 13', respectively.

Figure 5:
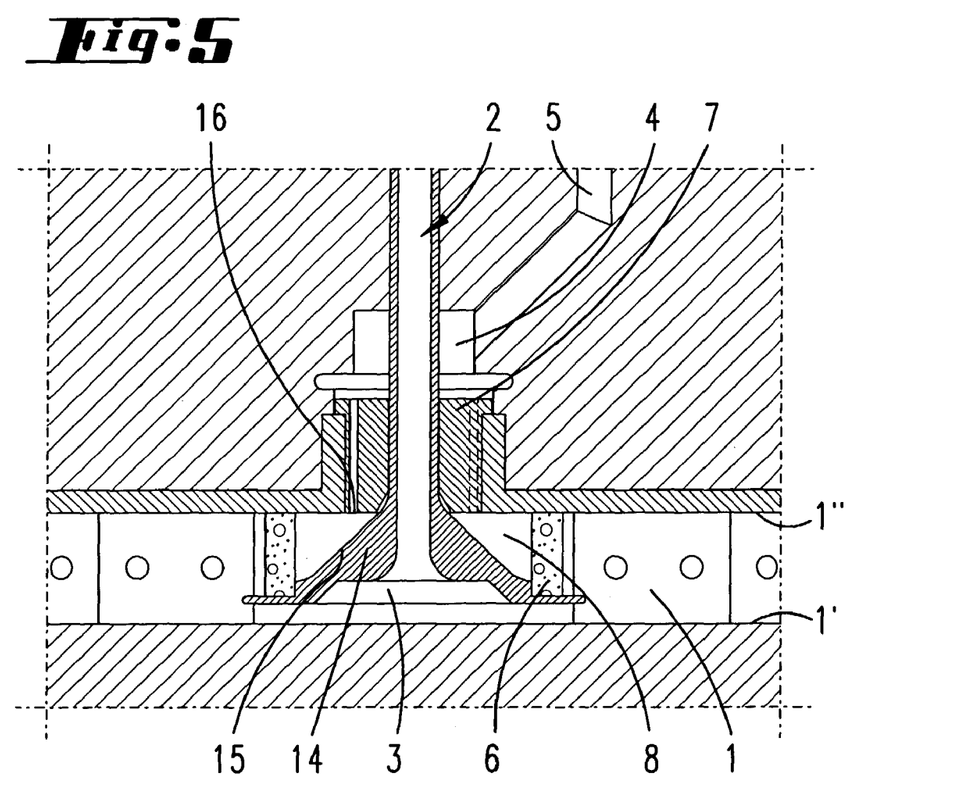
FIG. 5 shows a second exemplary embodiment according to FIG. 1.

On account of its increased thickness, the annular throttle 7 illustrated in FIG. 5 has a greater throttling action.

The exchangeable parts 14 illustrated in FIGS. 6 to 9 can be screwed to the upper part of the gas-admission element, which forms the central feed line 2 and the peripheral feed line 4, by means of a screw connection 12. A nut 11, which carries a plate which forms the process-chamber ceiling 1', is also screwed to this upper portion. The lower portion 6' of the gas-discharge ring 6 rests on a thin-walled radial annular projection which is formed by the edge portion 10 of the exchangeable part 14. At the top, the gas-discharge ring 6 is supported on the said plate or on the process-chamber ceiling 1'.

Figure 6:
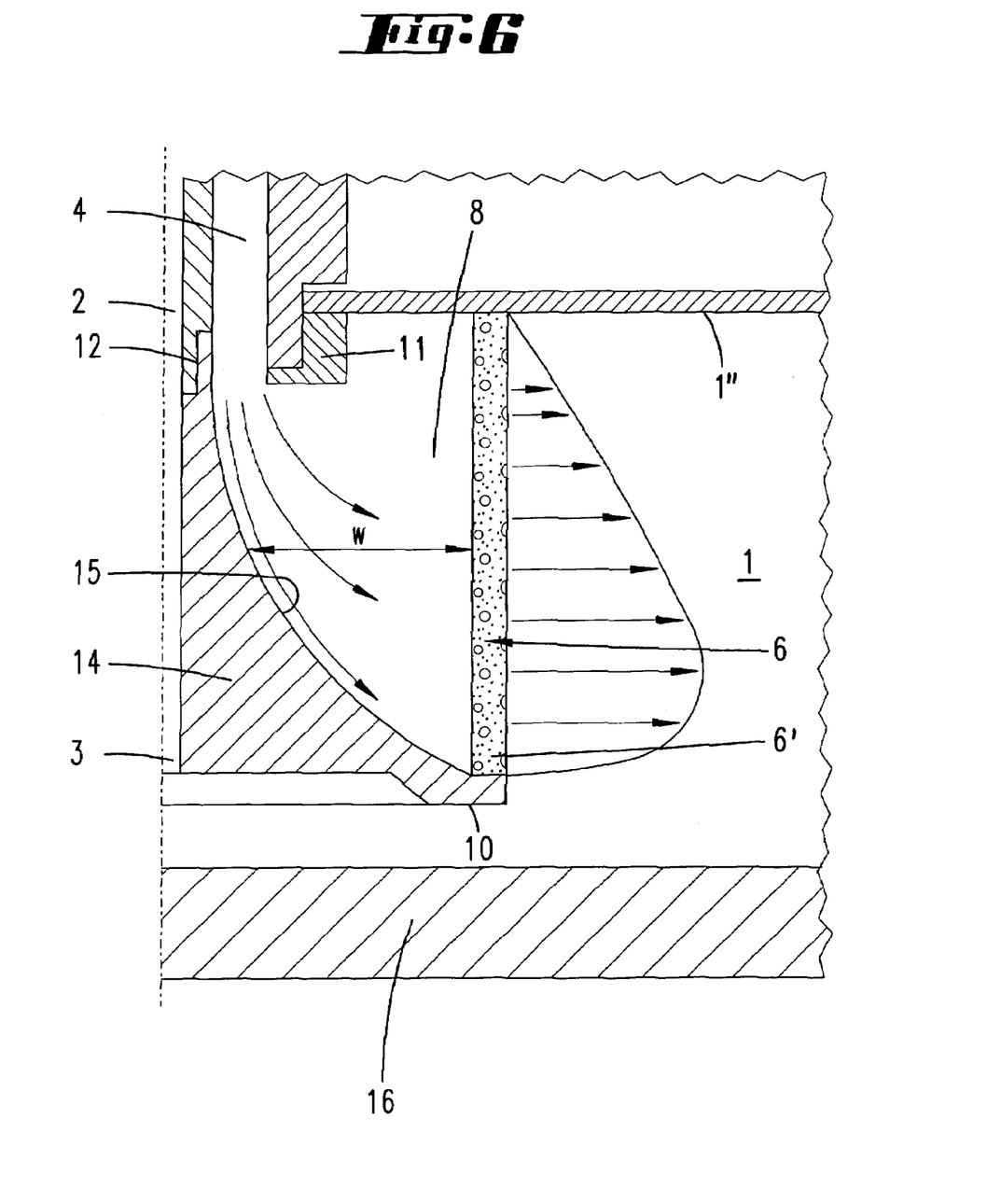
FIGS. 6-9 show a conversion set with differently configured exchangeable parts.
Figure 7:
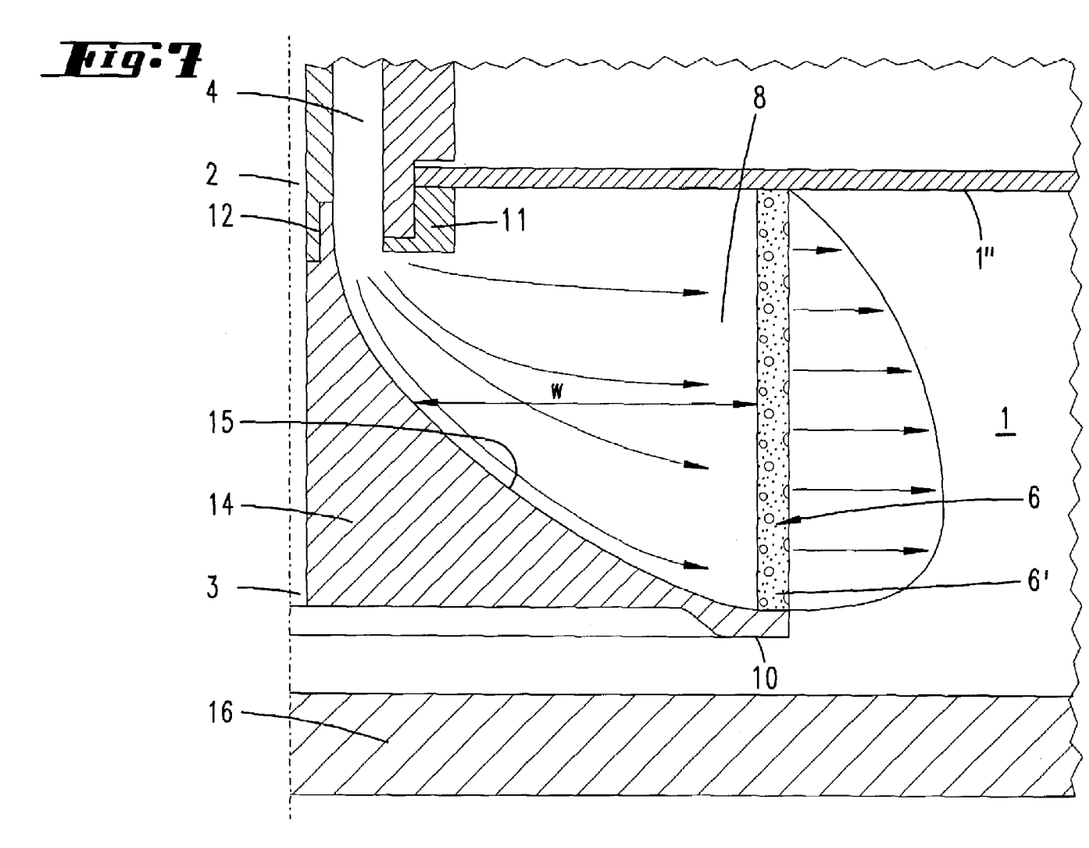
Figure 8:
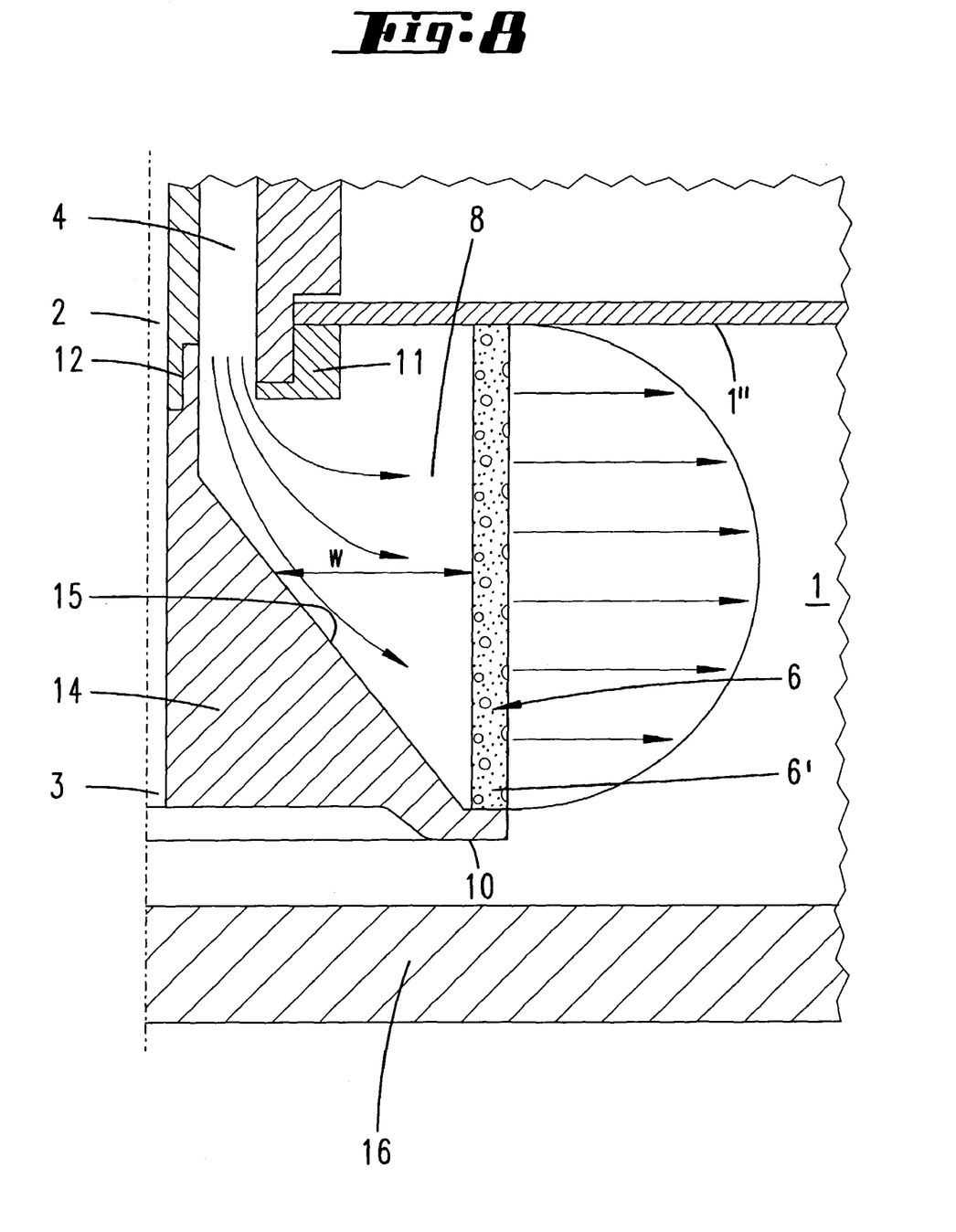
Figure 9:
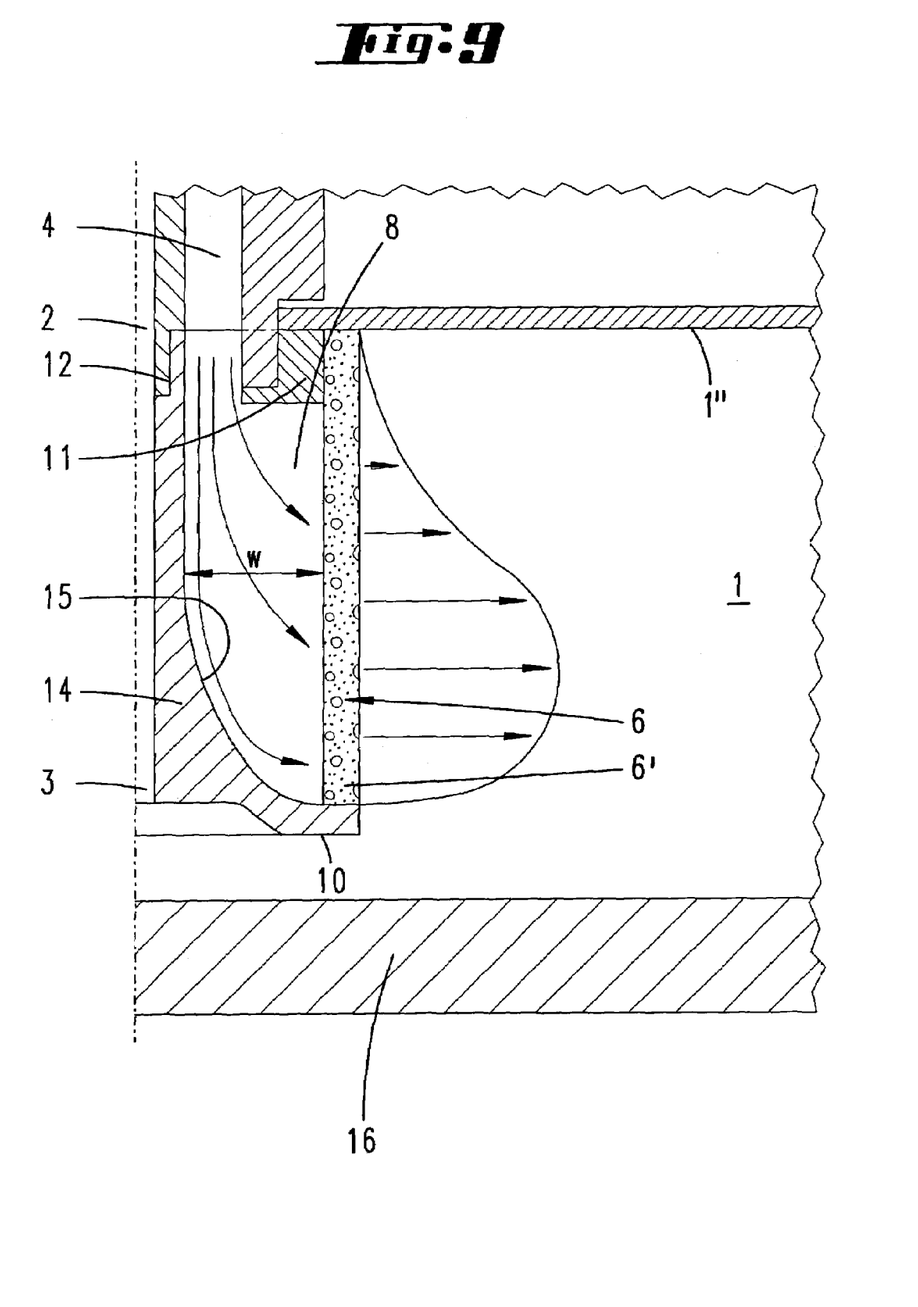

The individual exchangeable parts 14 shown in FIGS. 6 to 9 differ from one another substantially in terms of their diameter and in terms of the shape of their guiding surfaces. The guiding surfaces 15 of the exchangeable parts shown in FIGS. 6, 7 and 9 are substantially in the shape of a rotational hyperboloid. In the longitudinal section plane illustrated, the contour line of the gas-guiding surface 15 is concave in shape, this surface linking up with the wall of the peripheral line 4 running in the axial direction without any sudden jumps, so that no turbulence develops along the gas-guiding surface 15. The arrows illustrated outside the gas-discharge ring 6 indicate the axial flow profile. It can be seen that the maximum of this profile lies closer to that end 6' of the gas-discharge ring which is close to the susceptor than to that region of the gas-discharge ring which is close to the process-chamber ceiling 1'. The result of this is that the region close to the susceptor and therefore also the edge portion 10 are more strongly cooled by convection. In all the exemplary embodiments, the width W of the annular chamber 8 decreases in the axial direction from the ceiling 1' to the susceptor 16.

In the exemplary embodiment illustrated in FIG. 8, the contour line of the gas-guiding surface 15 of the longitudinal section is in the form of a straight line, so that the guide surface 15 is frustoconical in shape. This shape is selected for high volumetric flows.

The susceptor 16 is heated from below by means of a high-frequency heating means (not shown). The susceptor 16 radiates heat which heats the quartz body 14 of the gas-discharge element. The first process gas, which consists of arsine or phosphine and hydrogen, flows through the central outlet opening 3. The arsine or phosphine which emerges through the opening 3 decomposes in the gap between the quartz body 14 and the surface of the susceptor 16. The decomposition products are transported onward in the radial direction. TMG or TMI together with hydrogen as second process gas initially flows out of the peripheral line 4 into the antechamber 8. The gas emerging from the axial line 4 flows in laminar fashion along the guiding surface 15 and in the process is diverted through 90°. In the process, it flows over the edge portion 10. Since the gas flowing out of the line 4 is not preheated, but rather is substantially at room temperature, it has a cooling action with respect to the quartz body 14. The heat is taken up via the guiding surface 15. The gas stream has its greatest cooling action in particular where the material thickness of the quartz part 14 is least, namely in the region of the edge portion 10. This region and in particular the gas-discharge ring portion 6' which is adjacent to the edge portion 10 are therefore cooled most strongly by the gas stream. The process-chamber ceiling 1' is unheated. Accordingly, without a cooling gas stream, the region 6' of the gas-discharge ring 6 would be the hottest, since it is closest to the hot susceptor 16. On account of the convective cooling of the process gas emerging from the line 4, however, the region 6' of the gas-discharge ring 6 which is close to the susceptor is kept at a temperature which substantially corresponds to the temperature of the remaining region of the gas-discharge ring 6. This temperature is higher than the condensation temperature of the arsenic or phosphorus formed in the gap between the susceptor 16 and the quartz body 14. However, the temperature is lower than the deposition temperature of the III-V compound.

The flow parameters should be set in such a way that the gas-discharge ring as far as possible has a constant temperature over its axial length.

The profile of the gas-guiding surface 15 is matched to the process parameters by substituting an exchangeable part.

All features disclosed are (inherently) pertinent to the invention. The disclosure content of the associated/appended priority documents (copy of the prior application) is hereby incorporated in its entirety in the disclosure of the application, partly with a view to incorporating features of these documents in claims of the present application.

What is claimed is:

1. Gas-admission element for a device for depositing in particular crystalline layers on in particular layers on in particular crystalline substrates, by means of which two process gases can be introduced into a process chamber of a reactor separately from one another above a heatable susceptor, the gas-admission element having a central feed line with a central end-side outlet opening for a first process gas, and having a peripheral line which is peripheral with respect to the central feed line that flows a second process gas into an annular antechamber surrounded by a rotationally symmetrical gas-permeable gas-discharge ring, the second process gas emerges through the rotationally symmetrical gas permeable gas-discharge ring, the radial width of the annular antechamber decreases toward the free end of the rotationally symmetrical gas permeable gas-discharge ring, on account of a gas-guiding surface which does not run parallel to the central axis in longitudinal section, characterized by a frustoconical or rotationally hyperboloid-shaped gas-guiding surface, which is formed by the gas-guiding surface, for convective cooling of the portion of the rotationally symmetrical gas-permeable gas-discharge ring which is close to the susceptor, by means of the second process gas flowing along the gas-guiding surface.

2. Gas-admission element according to claim 1, characterized in that the rotationally symmetrical gas-permeable gas-discharge ring consists of porous material and in particular is a quartz frit.

3. Gas-admission element according to claim 2, characterized in that the gas-guiding surface is associated with an exchangeable part.

4. Gas-admission element according to claim 3, characterized in that the gas-guiding surface links up with the peripheral line without there being a step.

5. Gas-admission element according to claim 4, characterized in that the exchangeable part can be screwed to the feed line or can be connected to the feed line by way of a bayonet connection.

6. Gas-admission element according to claim 1, wherein the rotationally symmetrical gas-permeable gas-discharge ring holds the pressure in the annular antechamber at a higher level than the process chamber pressure.

7. Gas-admission element according to claim 6, wherein the rotationally symmetrical gas-permeable gas-discharge ring consists of porous material.

8. Gas-admission element according to claim 7, wherein the rotationally symmetrical gas-permeable gas-discharge ring consists of a quartz frit.

9. Gas-admission element for a device for depositing in particular crystalline layers on in particular layers on in particular crystalline substrates, by means of which two process gases can be introduced into a process chamber of a reactor separately from one another above a heatable susceptor, the gas-admission element having a central line with a central end-side outlet opening for a first process gas, and having a peripheral line which is peripheral with respect to the central line that flows a second process gas into an annular antechamber surrounded by a rotationally symmetrical gas-permeable gas-discharge ring, the second process gas emerges through the rotationally symmetrical gas-permeable gas-discharge ring, the radial width of the annular antechamber decreases toward the free end of the rotationally symmetrical gas-permeable gas-discharge ring, on account of a gas-guiding surface which does not run parallel to the central line in longitudinal section, characterized by a frustoconical or rotationally hyperboloid-shaped gas-guiding surface, which is formed by the gas-guiding surface, for convective cooling of the portion of the rotationally symmetrical gas-permeable gas-discharge ring which is close to the susceptor, by means of the second process gas flowing along the gas-guiding surface; wherein the gas-guiding surface is associated with an exchangeable part.

* * * * *